(12) United States Patent
Yu

(10) Patent No.: US 12,013,437 B2
(45) Date of Patent: Jun. 18, 2024

(54) MACHINE LEARNING SYSTEM AND METHOD TO DETECT CIRCUIT BREAKER CONDITIONS IN A NETWORK OPERATING ENVIRONMENT

(71) Applicant: VERIZON PATENT AND LICENSING INC., Basking Ridge, NJ (US)

(72) Inventor: Qiao Yu, Ashburn, VA (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 150 days.

(21) Appl. No.: 17/674,354

(22) Filed: Feb. 17, 2022

(65) Prior Publication Data

US 2023/0258724 A1 Aug. 17, 2023

(51) Int. Cl.
*G01R 31/327* (2006.01)
*G06N 3/02* (2006.01)
*G06N 3/084* (2023.01)

(52) U.S. Cl.
CPC ......... *G01R 31/3277* (2013.01); *G06N 3/084* (2013.01)

(58) Field of Classification Search
CPC ........... G06N 20/00; G06N 3/084; G06N 3/02
See application file for complete search history.

(56) References Cited

U.S. PATENT DOCUMENTS

| | | | |
|---|---|---|---|
| 2001/0022558 A1* | 9/2001 | Karr, Jr. ................ | G01S 5/0278 342/450 |
| 2019/0260204 A1* | 8/2019 | Koval ........................ | H02J 3/14 |
| 2019/0324439 A1* | 10/2019 | Cella ..................... | G06F 18/217 |
| 2020/0293032 A1* | 9/2020 | Wang .................. | G01R 19/2513 |
| 2020/0293627 A1* | 9/2020 | Wang .................... | G06F 30/367 |

\* cited by examiner

*Primary Examiner* — Jermele M Hollington
*Assistant Examiner* — Temilade S Rhodes-Vivour

(57) ABSTRACT

A predictive circuit breaker model and system for network application is disclosed. In some embodiments, the techniques described herein relate to a method that includes receiving telemetry data from one or more network applications; generating a set of feature vectors based on the telemetry data, the set of feature vectors associated with at least one network application in the one or more network applications; inputting the set of feature vectors into a machine learning (ML) model to generate a prediction, the prediction including a binary classification of the set of feature vectors; and triggering at least one circuit breaker function in response to the prediction.

20 Claims, 6 Drawing Sheets

MACHINE LEARNING SYSTEM AND METHOD TO DETECT CIRCUIT BREAKER CONDITIONS IN A NETWORK OPERATING ENVIRONMENT

BACKGROUND

Network applications can fall into states whereby continued operation of the network applications may result in negative impacts on a network environment. For example, a corrupted database application generating repeated warnings or errors can provide corrupt data to downstream applications, comprising the integrity of the entire pipeline of downstream applications relying on the database application. Various attempts to detect and prevent these situations rely on hardcoded rules which are rigid, overly complicated, and do not capture unpredictable scenarios.

DETAILED DESCRIPTION

Figure 1:
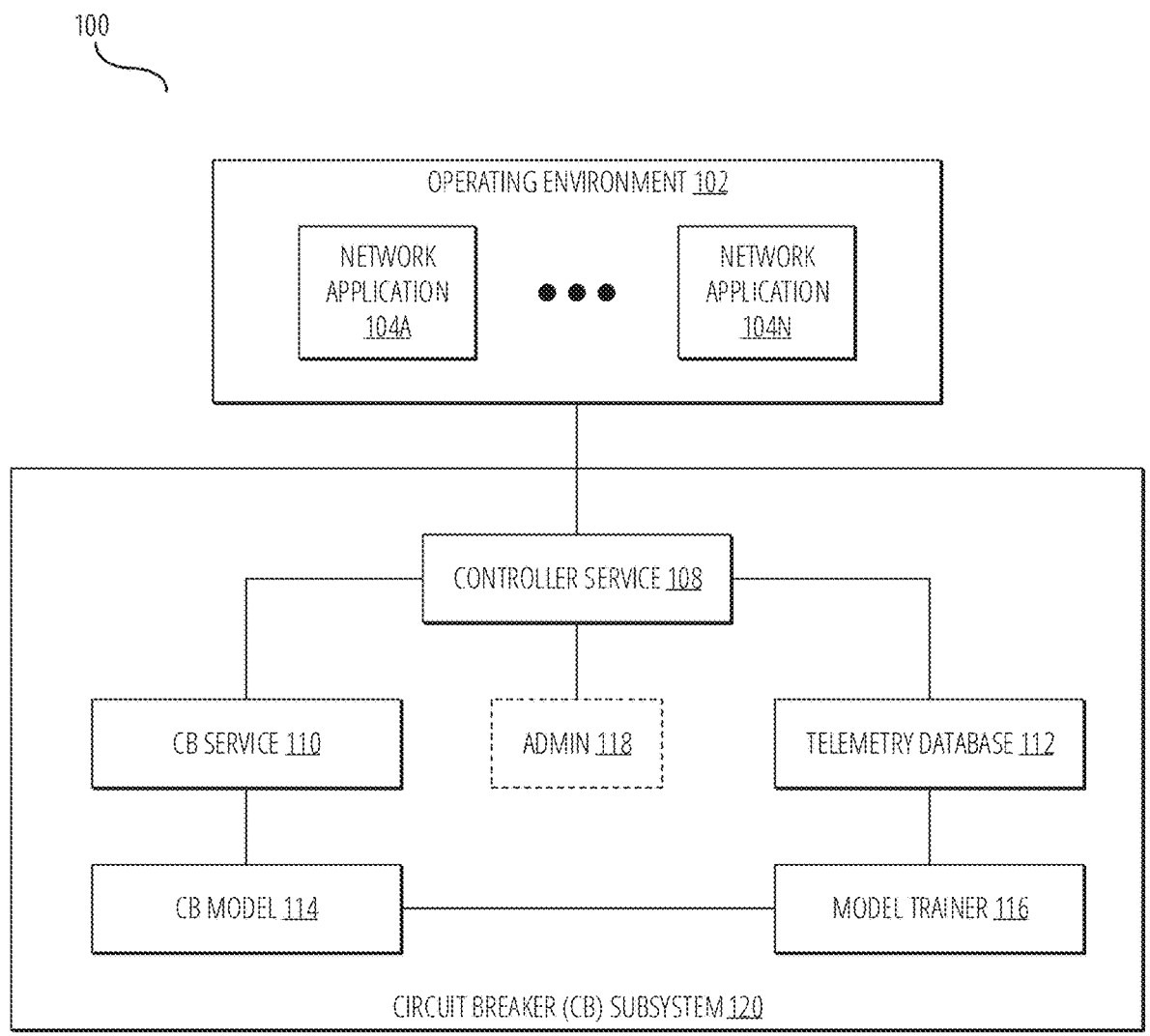
FIG. 1 is a block diagram illustrating a system implementing circuit breaker functionality according to some of the example embodiments.

In computer networks, a circuit breaker refers to an automated process that can disable a network application in response to a detected condition. In some embodiments, this automated process can disable a network application temporarily or permanently. In some embodiments, the detected condition can comprise a condition related to the performance of the network application (e.g., computing resource consumed), the network itself (e.g., bandwidth utilization), regulatory requirements, service level requirements, or other types of conditions.

Previous approaches use hard-coded rules to detect such conditions. However, such approaches fail to accurately detect true circuit breaker conditions. The example embodiments, which utilize an ML-based approach, more accurately depict conditions that require circuit breaker functions on network applications. The example embodiments use a non-linear transformation approach that more accurately predicts such conditions as compared to purely linear approaches.

In the various embodiments, a network platform is described that includes a plurality of network applications operating simultaneously. In an embodiment, a monitoring device or process continuously records telemetry data describing the operations of the network applications. In some embodiments, the telemetry data is combined to form a vector of features. In some embodiments, the vector of features can be associated with telemetry data of a single network application. In other embodiments, the vector of features can be associated with telemetry data of a subset of all network applications. In other embodiments, the vector of features can be associated with telemetry data of all network applications. In the embodiments, data collectors report telemetry data to a controller service which can then use the telemetry data to predict whether one or more network applications should be controlled. As used herein, controlling a network application refers to taking an action that involves the network application including, but not limited to, pausing the network application, halting the network application, raising the alarm or alert regarding the network application, adjusting an operating parameter of the network application, rebooting the network application, etc.

In the embodiments, the feature vector is input into a machine learning (ML) model, which outputs a classification of the feature vector. In some embodiments, the classification can be a binary classification. In some embodiments, this binary (or other) classification can represent whether an action should be taken with respect to one or more network applications. In some embodiments, the output of the ML model can comprise a bit vector, the dimensionality of the bit vector corresponding to the number of network applications. In this embodiment, each bit is set based on whether an action should be taken on the network application.

In some embodiments, the ML model comprises a deep learning network. In an embodiment, the deep learning network can include multiple layers. In an embodiment, the ML model can include a first layer including alternating memory unit neurons and transparent neurons. In an embodiment, a second layer can include a plurality of custom neurons that extend the output of the first layer, as described in more detail herein. In an embodiment, after the second layer, the ML model includes one or more repeating layers. In an embodiment, a given repeating layer can include an activation layer coupled to a linear transformation layer. In some embodiments, the ML model includes six repeating layers. Finally, in an embodiment, the output of the final repeating layer can be fed to a final activation function. In an embodiment, the final activation function can include a sigmoid activation function. In an embodiment, the output of the final activation function can comprise a signal indicating whether an action should be taken on one or more network applications.

In some embodiments, the techniques described herein relate to a method that receives telemetry data from one or more network applications and generates a set of feature vectors based on the telemetry data that are associated with at least one of the network applications. The method then includes inputting the set of feature vectors into a machine learning model to generate binary classifications of the set of feature vectors. Based on these predictions, the method can include triggering at least one circuit breaker function.

In some embodiments, inputting the set of feature vectors into a machine learning model includes inputting the set of feature vectors into a neural network. In some embodiments, inputting the set of feature vectors into a neural network includes inputting the set of feature vectors into a pretraining layer which outputs data to a plurality of transform layers, each layer in the plurality of transform layers including an activation layer and a linear transformation layer. In some embodiments, the pretraining layer includes a memory layer that outputs data to a circuit breaker layer.

In some embodiments, the neural network is trained by backpropagating a loss from the neural network through the pretraining layer. In some embodiments, triggering at least one circuit breaker function includes triggering a plurality of circuit breaker functions. In some embodiments, triggering at least one circuit breaker function includes transmitting an alert and receiving a response to the alert, and the method further includes using the response to the alert as a label for training the machine learning model.

In some embodiments, the techniques described herein relate to a non-transitory computer-readable storage medium, including instructions that, when executed by a computer, cause the computer to perform the above methods. In some embodiments, the techniques described herein relate to a device that includes a processor configured to perform the above methods.

Various details regarding the aforementioned embodiments are described herein.

FIG. 1 is a block diagram illustrating a system implementing circuit breaker functionality according to some of the example embodiments.

In an embodiment, system 100 includes an operating environment 102. In an embodiment, the operating environment 102 can be a network of computing devices, a cloud computing platform, a container platform, or generally any combination of computing hardware and software to deploy network applications. As illustrated, operating environment 102 can execute one or more network applications (e.g., network application 104A through network application 104N). A network application refers to a software application running in a computer network. The specific types of network applications (e.g., databases, application servers, logging daemons, etc.) or the operations they perform are not limiting. In an alternative embodiment, operating environment 102 can comprise a single computing device running one or more applications, for example, a desktop computer running one or more applications. Thus, while the embodiments describe network-oriented environments, the disclosure is not limited as such. In general, any computing device or network that includes at least one application generating data can be used as the operating environment 102.

During operation, the network applications periodically output data to circuit breaker subsystem 120. This data generally relates to the operation or performance of a given network application. In the various embodiments, such data is referred to as telemetry data. Telemetry data can include various types of metadata describing a network application, such as event data, metrics data, and log data. In some embodiments, event data can comprise data describing an action occurring in a network application (e.g., a changed server setting, error, etc.). Metrics data generally refers to aggregated event data (e.g., a count of events over time) or a numeric measurement (e.g., processor temperature). Log data generally refers to messages recorded by a network application (e.g., database query statements). The disclosure is not limited to the specifically described types of telemetry data, and other types can be used. In general, however, telemetry data is generated on periodic and continuous data by each network application.

In an embodiment, circuit breaker subsystem 120 includes a controller service 108. In some embodiments, a single controller service can be used to receive data from all network applications. In other embodiments, each network application can be associated with its own controller service. In other embodiments, a subset of the network applications can be associated with one controller service while other subsets of network applications can be associated with other controller services. In some embodiments, controller service 108 can be implemented as a virtual machine, container, or other software-based services. In some embodiments, an orchestrator can deploy one or more controller services as needed by the operating environment 102.

In an embodiment, the controller service 108 receives telemetry data and performs various operations thereon before forwarding the processed telemetry data to other endpoints. In an embodiment, the controller service 108 can be configured to perform deduplication, format conversions, or other preliminary data cleaning operations to ensure that the telemetry data is suitable for further processing. In some embodiments, controller service 108 can generate feature vectors based on raw telemetry data. For example, a feature vector may require certain features to be present, while features not required by the feature vector can be dropped. Thus, in some embodiments, controller service 108 can operate as a filter to extract the needed telemetry data and discard unused telemetry data. In some embodiments, this filtering can be performed only on telemetry data sent to the circuit breaker service 110, while all telemetry data can be transmitted to telemetry database 112. In other embodiments, the controller service 108 may only transmit filtered data to circuit breaker service 110 and telemetry database 112.

In some embodiments, the format of the feature vector can take various forms. In some embodiments, the feature vector can include features for every network application but may only include a non-null feature for a given network application. Thus, in some embodiments, the feature vectors for a given network application will be sparse, including only meaningful data for a small portion of all possible features. In other embodiments, feature vectors may be associated only with a feature for a given network application or type. In such an embodiment, features vectors can vary in dimensionality based on the network application or type of network application. In some embodiments, the varying dimensionality may be maintained. In other embodiments, the largest dimensionality can be set, and all feature vectors having a dimensionality less than the largest dimensionality can be zero-padded. In yet another embodiment, one or more convolution operations can be applied to the feature vector to reduce the dimensionality of the feature vector. In yet another embodiment, a set of shared features can be selected such that every network application can be associated with the set of shared features based on telemetry data. For example, common features such as uptime, central processing unit (CPU) utilization, etc., may be used as shared features.

In an embodiment, the controller service 108 transmits one or more feature vectors to circuit breaker service 110 for predicting whether a circuit breaker function should be enabled for a given network application associated network application. In some embodiments, the controller service 108 batches feature vectors for a given network application according to predetermined window size. The circuit breaker service 110 receives feature vectors from controller service 108 and schedules a prediction task to be performed by circuit breaker model 114. In some embodiments, the circuit breaker service 110 acts as a queue for incoming feature vector(s). Details of circuit breaker model 114 are provided in connection with FIG. 2 and are not repeated herein. In brief, circuit breaker model 114 comprises a machine learning (ML) model such as a deep-learning model that predicts whether a circuit breaker function should be triggered based on the input feature vectors. The telemetry database 112 is configured to store the prediction from circuit breaker service 110 through controller service 108 in order to improve subsequent training phases.

As discussed, after transmitting one or more feature vectors to circuit breaker service 110, the controller service 108 receives a prediction. In an embodiment, the prediction can comprise a binary classification of whether a circuit breaker function should be applied for a given network application. In response to the prediction, controller service 108 can be configured to perform a circuit breaker function on a given network application. The circuit breaker function can include various types of functions. For example, the circuit breaker function can include one or more of (1) rebooting the network application; (2) starting a backup or redundant version of the network application; (3) re-routing traffic from the network application to an alternative network application; (4) stopping the network application; (5) restoring the network application to a prior state; (6) moving the network application to a different physical computing device; (7) re-routing traffic from a current version of the network application to a different version of the network application; (8) shutdown pending transactions of the network application; (9) isolate the computing device running the network application; (10) backing up data used by the network application; (11) dumping data used by the network application; (12) enabling extended logging of operations of the network application; (13) requiring additional verification before other devices use the network application; (14) transmitting a warning message to an administrator 118 or other device; (15) generating a report of the predicted result; or (16) any other user-defined actions. Certainly, in some embodiments, controller service 108 can perform multiple circuit breaker functions in response to a prediction. Further, in some embodiments, the controller service 108 can perform different actions for different network applications. Thus, in some embodiments, the controller service 108 can store a "rule set" of circuit breaker functions to apply for a given network application or network application type when the prediction indicates to perform a circuit breaker function.

Additionally, controller service 108 is configured to transmit either feature vectors or telemetry data to telemetry database 112 for persistent storage. In some embodiments, controller service 108 can associate a network application identifier or type with the feature vectors or telemetry data before transmitting to telemetry database 112. In an embodiment, telemetry database 112 can comprise any storage medium capable of persistently storing data such as a relational database, NoSQL database, distributed filesystem, or database, etc.

The circuit breaker subsystem 120 includes a model trainer 116 configured to read data from telemetry database 112 and update/retrain the circuit breaker model 114. As discussed, the controller service 108 populates the telemetry database 112 with feature vectors or raw telemetry data. If telemetry database 112 includes raw telemetry data, the model trainer 116 can be configured to generate feature vectors in a manner similar to that described with respect to controller service 108.

Further, to train the circuit breaker model 114, the model trainer 116 uses labeled feature vectors. In an embodiment, an administrator 118 can provide manual labels for feature vectors or raw telemetry data. In some embodiments, an administrator 118 can manually review feature vectors or raw telemetry data stored in telemetry database 112 and annotate the data with labels (e.g., a binary classification label). In other embodiments, an administrator 118 can receive a prediction from controller service 108 for a given window of feature vectors and can either confirm or reject the prediction. This confirming or rejecting can then be used as a label for the feature vectors or raw telemetry data stored in telemetry database 112. For example, one of the circuit breaker functions can comprise an alert to administrator 118 requesting permission to execute another circuit breaker function (e.g., shut down a network application). If the administrator 118 consents to the performing of another circuit breaker function, the feature vectors that generated the prediction can be labeled as positive and used for retraining. Details of training the circuit breaker model 114 are described further herein and are not repeated.

As discussed above and explained further herein, system 100 allows for automatic detection of a circuit breaker condition using an ML model that can be continuously retrained to improve performance. Details of this ML model are further provided in connection with FIG. 2, and operations of specific components are described in FIGS. 3 through 5.

Figure 2:
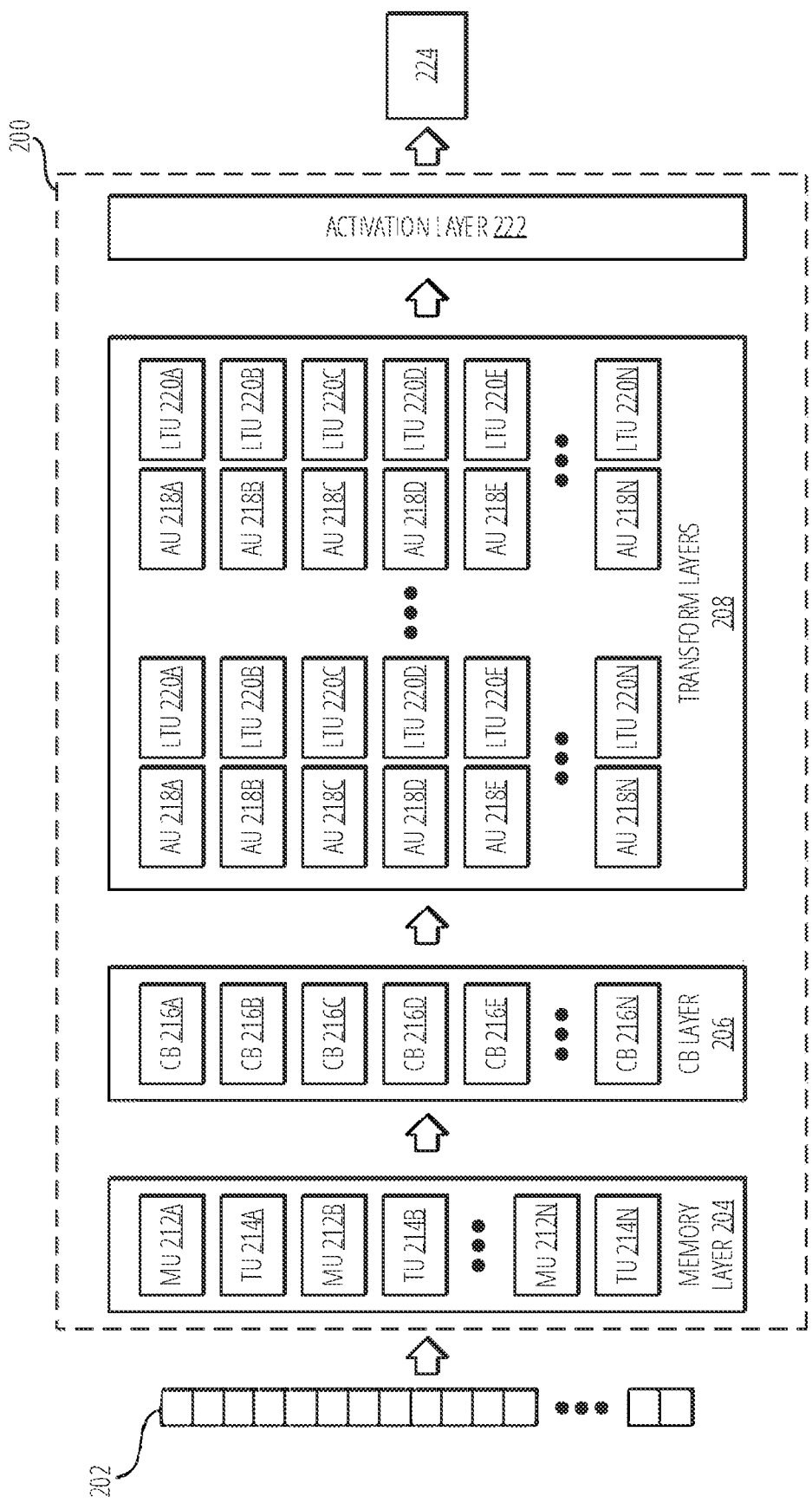
FIG. 2 is a block diagram illustrating a circuit breaker model according to some of the example embodiments.

FIG. 2 is a block diagram illustrating a circuit breaker model according to some of the example embodiments. In an embodiment, model 200 corresponds to circuit breaker model 114, described in connection FIG. 1, the disclosure of which is incorporated in its entirety herein.

In an embodiment, a feature vector 202 is input into model 200. In response to the feature vector 202, model 200 outputs a prediction 224. The feature vector 202 can comprise a set of features related to, or derived from, telemetry data of one or more network applications. The prediction 224 can comprise either a binary classification or a continuous value. For example, a binary classification (e.g., "yes" or "no") can indicate whether a circuit breaker function should be called. As another example, a continuous value prediction can indicate a "score" (e.g., between 0 and 1) that represents how likely a circuit breaker function should be called. For continuous values, downstream applications can use rules to determine when to trigger a circuit breaker function in response to a continuous prediction. Details of feature vector 202 and prediction 224 were discussed in connection with FIG. 1 and are not repeated herein.

In an embodiment, model 200 comprises an ML model. In an embodiment, the ML model can comprise a neural network. In an embodiment, the neural network can comprise an artificial neural network (ANN). In an embodiment, the ANN can comprise a deep learning network. In an embodiment, the deep learning network can comprise a deep neural network, deep belief network, deep reinforcement learning model, recurrent neural network (RNN), convolutional neural network (CNN), or a similar type of multi-layer network. The illustrated embodiment illustrates one particular configuration of layers of model 200; however, the disclosure should not be limited as such. Other models can include more or fewer layers, different permutations of layers, or layers different than that illustrated.

In an embodiment, model 200 includes a memory layer 204. As illustrated, in some embodiments, the memory layer 204 receives data from the feature vector 202. In some embodiments, connections between each layer (and between feature vector 202 and memory layer 204 and between transform layers 208 and activation layer 222) are bipartite. That is, each input is connected to every neuron in the next layer. Thus, as one example, each feature in the feature vector 202 is connected to every neuron in memory layer 204, each neuron in memory layer 204 is connected to every neuron in CB layer 206, etc. Further, in an embodiment, each final neuron in transform layers 208 provides output to a single activation function (e.g., sigmoid).

In an embodiment, the memory layer 204 receives features from feature vector 202. In an embodiment, memory layer 204 and feature vector 202 are partially similar to a Restricted Boltzmann Machine (RBM). The memory layer 204 includes a plurality of memory units (212A-212N) and a plurality of transparent units (214A-214N). In some embodiments, the memory layer 204 includes n total units and includes n/2 memory units and n/2 transparent units. In an embodiment, the memory units can comprise modified long-short term memory (LSTM) units. Common LSTM units include a cell, input gate, output gate, and forget gate. However, the memory units (212A-212N) comprise LSTM units that do not include gates and include a fixed forget rule. Further, the transparent units (214A-214N) are configured to transmit inputs without modification to the next layer. As a result, memory layer 204 operates to pass all current features as well as history data to CB layer 206 for processing.

In an embodiment, the CB layer 206 includes n CB units (216A-216N). In an embodiment, a given CB unit is similar to a Best Matching Unit (BMU) in a Self-Organizing Feature Map (SOFM). That is, the CB units generally generate an extended feature from an input feature. However, unlike BMUs the extended feature is the determined values that are the average grid values of the accuracy. More specifically, during initialization, model 200 calculates the input size to the CB layer 206 (i.e., the output of the memory layer 204). Next, model 200 extends this input size based on a preconfigured accuracy parameter to obtain an extended input size. Next, model 200 will randomly initialize a weight tensor (W) having the same dimensionality of the extended input size and randomly initialize a bias tensor (B) having the same dimensionality as the input size. Finally, model 200 will build a lookup table based on the extended input size and store the lookup table in a tensor (K). In some embodiments, the size of the lookup table can be the extended input size, the extended input size being associated with the accuracy and used to store the lookup table.

During prediction, the CB layer 206 reshapes its input vector (from memory layer 204) to obtain the differences of each of the elements and stores the difference as a tensor (D). Next, the CB layer 206 uses a function (e.g., a step function such as a Heaviside step function) to filter D and stores the result in a new tensor (S). Next, the CB layer 206 combines both the original vector and the vector stored in S to obtain a tensor Y. Finally, the CB layer 206 can compute YW+B to obtain an output vector which is passed to transform layers 208 as an input.

The outputs from CB layer 206 are provided to the layers of transform layers 208. In an embodiment, the transform layers 208 can include multiple layers in serial such that data is transformed sequentially by the layers. In an embodiment, transform layers 208 can include six layers. In an embodiment, each layer in transform layers 208 includes n neurons. In an embodiment, each layer in transform layers 208 is identical. In an embodiment, each layer in transform layers 208 includes a first sublayer of activation units (218A-218N) comprising an activation layer and a second sublayer of linear transformation units (220A-220N). In an embodiment, the activation units can comprise any activation function. In an embodiment, the activation units can comprise non-linear activation units. In an embodiment, the activation units can comprise rectified linear units (ReLUs). In an embodiment, the activation units can comprise Leaky ReLUs. In an embodiment, the linear transformation units can comprise any linear transformation neurons. In an embodiment, the linear transformation units can comprise linear function units or polynomial function units. In an embodiment, the transform layers 208 can be considered its own independent neural network. In this manner, memory layer 204 and CB layer 206 can be viewed as a pretraining processor of the neural network formed in transform layers 208. However, existing networks that utilize a pretraining processor (e.g., RBM or SOFM) generally do not back-propagate from the neural network to the pretraining processor. As will be discussed, model 200 can be trained in such a manner.

The outputs of the final sublayer (i.e., linear transformation sublayer) are output to an activation layer 222. In an embodiment, the activation layer 222 can comprise a single activation neuron. In some embodiments, the activation neuron can comprise a non-linear activation neuron. In some embodiments, the non-linear activation neuron can comprise a sigmoid function. Other activation functions may be used (e.g., hyperbolic linear tangent, ReLU, Leaky ReLU, Parametric ReLu, softmax, etc. In an embodiment, the output of the activation layer 222 comprises the prediction 224, as discussed previously.

Figure 3:
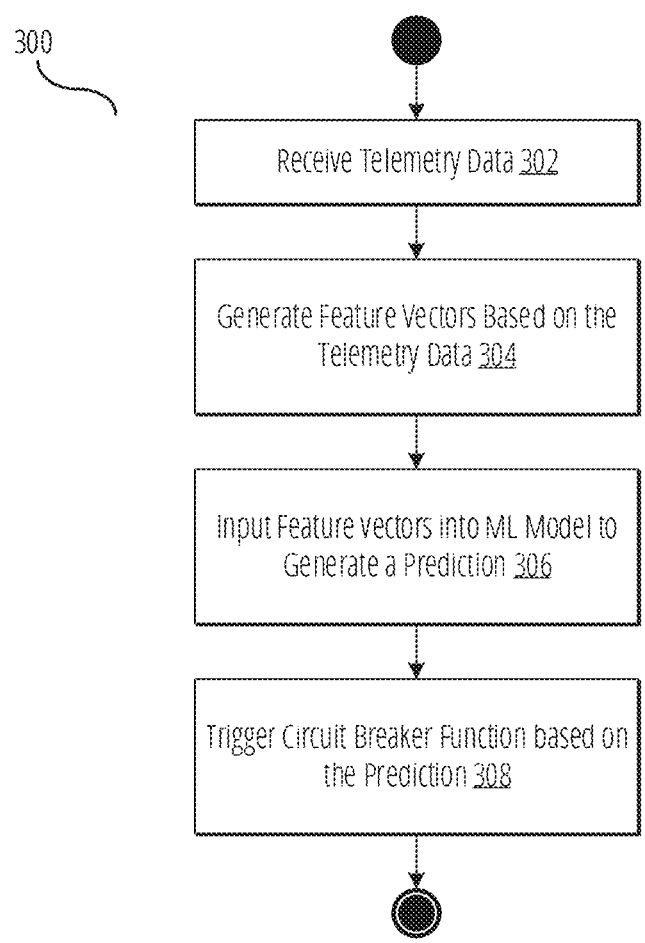
FIG. 3 is a flow diagram illustrating a method for detecting a circuit breaker condition and performing operations in response according to some of the example embodiments.

FIG. 3 is a flow diagram illustrating a method for detecting a circuit breaker condition and performing operations in response according to some of the example embodiments.

In step 302, method 300 can include receiving telemetry data from one or more network applications.

In an embodiment, telemetry data can include various types of metadata describing a network application, such as event data, metrics data, and log data. In some embodiments, event data can comprise data describing an action occurring in a network application (e.g., a changed server setting, error, etc.). Metrics data generally refers to aggregated event data (e.g., a count of events over time) or a numeric measurement (e.g., processor temperature). Log data generally refers to messages recorded by a network application (e.g., database query statements). The disclosure is not limited to the specifically described types of telemetry data, and other types can be used. In general, however, telemetry data is generated on periodic and continuous data by each network application. In an embodiment, method 300 can perform deduplication, format conversions, or other preliminary data cleaning operations to ensure that the telemetry data is suitable for further processing.

In step 304, method 300 can include generating a set of feature vectors based on the telemetry data. In an embodiment, the set of feature vectors can be associated with at least one network application in one or more network applications.

In some embodiments, method 300 can generate feature vectors based on raw telemetry data. For example, a feature vector may require certain features to be present with features not required by the feature vector can be dropped. Thus, in some embodiments, method 300 can operate as a filter to extract the needed telemetry data and discard unused telemetry data.

In some embodiments, the format of the feature vector can take various forms. In some embodiments, the feature vector can include features for every network application but may only include a non-null feature for a given network application. Thus, in some embodiments, the feature vectors for a given network application will be sparse, including only meaningful data for a small portion of all possible features. In other embodiments, feature vectors may be associated only with a feature for a given network application or type. In such an embodiment, features vectors can vary in dimensionality based on the network application or type of network application. In some embodiments, the varying dimensionality may be maintained. In other embodiments, the largest dimensionality can be set, and all feature vectors having a dimensionality less than the largest dimensionality can be zero-padded. In yet another embodiment, one or more convolution operations can be applied to the feature vector to reduce the dimensionality of the feature vector. In yet another embodiment, a set of shared features can be selected such that every network application can be associated with the set of shared features based on telemetry data. For example, common features such as uptime, central processing unit (CPU) utilization, etc. may be used as shared features.

In step 306, method 300 can include inputting the set of feature vectors into an ML model to generate a prediction. In an embodiment, the prediction can be a binary classification of the set of feature vectors. Details of step 306 are provided in the description of FIG. 4, which are not repeated herein in detail. In brief, the ML model classifies the set of feature vectors as either representing or not representing a circuit breaker condition. That is, in some embodiments, the prediction from the ML model can comprise a binary classification. As discussed, this binary classification can be used as a switch to trigger one or more circuit breaker functions. For example, a positive label or classification can cause method 300 to trigger a circuit breaker function in step 308 while a negative label or classification will cause method 300 to not trigger a circuit breaker function. Further, in some embodiments, regardless of the classification, the predicted classification can be used to generate labeled training data verified by an administrator.

In step 308, method 300 can include triggering at least one circuit breaker function in response to the prediction.

In response to the prediction, method 300 can be configured to perform a circuit breaker function on a given network application. The circuit breaker function can include various types of functions. For example, the circuit breaker function can include one or more of (1) rebooting the network application; (2) starting a backup or redundant version of the network application; (3) re-routing traffic from the network application to an alternative network application; (4) stopping the network application; (5) restoring the network application to a prior state; (6) moving the network application to a different physical computing device; (7) re-routing traffic from a current version of the network application to a different version of the network application; (8) shutdown pending transactions of the network application; (9) isolate the computing device running the network application; (10) backing up data used by the network application; (11) dumping data used by the network application; (12) enabling extended logging of operations of the network application; (13) requiring additional verification before other devices use the network application; (14) transmitting a warning message to an administrator 118 or other device; (15) generating a report of the predicted result; or (16) any other user-defined actions. Certainly, in some embodiments, method 300 can perform multiple circuit breaker functions in response to a prediction. Further, in some embodiments, method 300 can perform different actions for different network applications. Thus, in some embodiments, method 300 can store a "rule set" of circuit breaker functions to apply for a given network application or network application type when the prediction indicates to perform a circuit breaker function.

Figure 4:
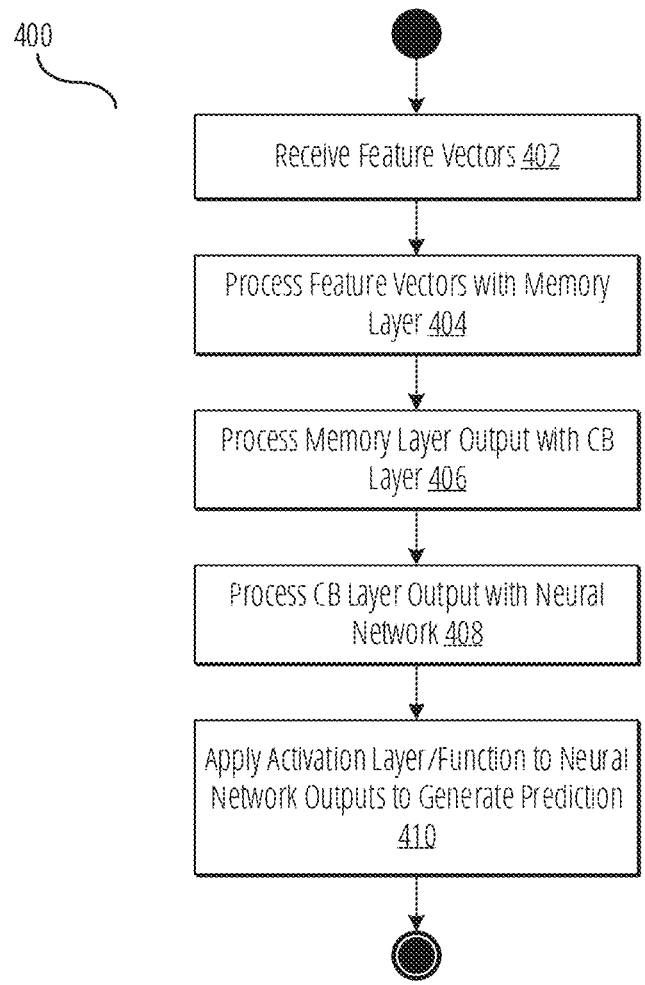
FIG. 4 is a flow diagram illustrating a method for predicting that a network application requires a circuit breaker function according to some of the example embodiments.

FIG. 4 is a flow diagram illustrating a method for predicting that a network application requires a circuit breaker function according to some of the example embodiments.

In step 402, method 400 can include receiving a set of feature vectors. In an embodiment, the feature vectors received in step 402 can correspond to the feature vectors generated in step 304, the disclosure of which is not repeated herein.

In step 404, method 400 can include processing the set of feature vectors using a memory layer.

In an embodiment, the memory layer receives the feature vector from step 402. In some embodiments, connections between each layer (and between the feature vector and memory layer) are bipartite. Thus, each feature in the feature vector is connected to every neuron in the memory layer. In an embodiment, the memory layer and feature vector are partially similar to an RBM. The memory layer includes a plurality of memory units and a plurality of transparent units. In some embodiments, the memory layer includes n total units and includes n/2 memory units and n/2 transparent units. In an embodiment, the memory units can comprise modified LSTM units. Common LSTM units include a cell, input gate, output gate, and forget gate. However, the memory units comprise LSTM units that do not include gates and include a fixed forget rule. Further, the transparent units are configured to transmit inputs without modification to the next layer. As a result, the memory layer operates to pass all current features as well as history data to a CB layer (described next) for processing.

In step 406, method 400 can include processing the memory layer output using a CB layer.

In an embodiment, the CB layer 206 includes n CB units. In an embodiment, a given CB unit is similar to a BMU in a SOFM. That is, the CB units generally generate an extended feature from an input feature. However, unlike BMUs the extended feature is the determined values that are the average grid values of the accuracy. More specifically, during initialization, method 400 can include calculating the input size to the CB layer (i.e., the output of the memory layer). Next, method 400 can include extending the input size based on a preconfigured accuracy parameter to obtain an extended input size. Next, method 400 can include randomly initializing a weight tensor (W) having the same dimensionality of the extended input size and randomly initializing a bias tensor (B) having the same dimensionality as the input size. Finally, method 400 can include presetting a grid based on the accuracy and storing the grid in a tensor (K). During prediction, step 406 can include reshaping its input vector (i.e., from step 404) to obtain the differences of each of the elements and storing the difference as a tensor (D). Next, step 406 can include using a Heaviside step function to filter D and storing the result in a new tensor (S). Next, step 406 can include combining both the original vector and the vector stored in S to obtain a tensor Y. Finally, step 406 can include computing YW+B to obtain an output vector which is passed to a neural network as input (discussed next).

In step 408, method 400 can include processing the CB layer output with a neural network.

As described above in the description of FIG. 2, in some embodiments, the neural network can comprise a plurality of layers. The outputs from step 406 are provided to the layers of the neural network (i.e., transform layers). In an embodiment, the transform layers can include multiple layers in serial such that data is transformed sequentially by the layers. In an embodiment, transform layers can include six layers. In an embodiment, each layer in transform layers includes n neurons. In an embodiment, each layer in transform layers is identical. In an embodiment, each layer in transform layers includes a first sublayer of activation units comprising an activation layer and a second sublayer of linear transformation units. In an embodiment, the activation units can comprise any activation function. In an embodiment, the activation units can comprise non-linear activation units. In an embodiment, the activation units can comprise ReLUs. In an embodiment, the activation units can comprise Leaky ReLUs. In an embodiment, the linear transformation units can comprise any linear transformation neurons. In an embodiment, the linear transformation units can comprise linear function units or polynomial function units. In an embodiment, the transform layers can be considered its own independent neural network. In this manner, the memory layer and CB layer can be viewed as a pretraining processor of the neural network formed in transform layers. However, existing networks that utilize a pretraining processor (e.g., RBM or SOFM) generally do not backpropagate from the neural network to the pretraining processor.

In step 410, method 400 can include applying an activation layer or function to the neural network outputs to generate a prediction.

The outputs of the final sublayer (i.e., linear transformation sublayer) are output to an activation layer. In an embodiment, the activation layer can comprise a single activation neuron. In some embodiments, the activation neuron can comprise a non-linear activation neuron. In some embodiments, the non-linear activation neuron can comprise a sigmoid function. Other activation functions may be used (e.g., hyperbolic linear tangent, ReLU, Leaky ReLU, Parametric ReLu, softmax, etc. In an embodiment, the output of the activation layer comprises a prediction, as discussed previously.

Figure 5:
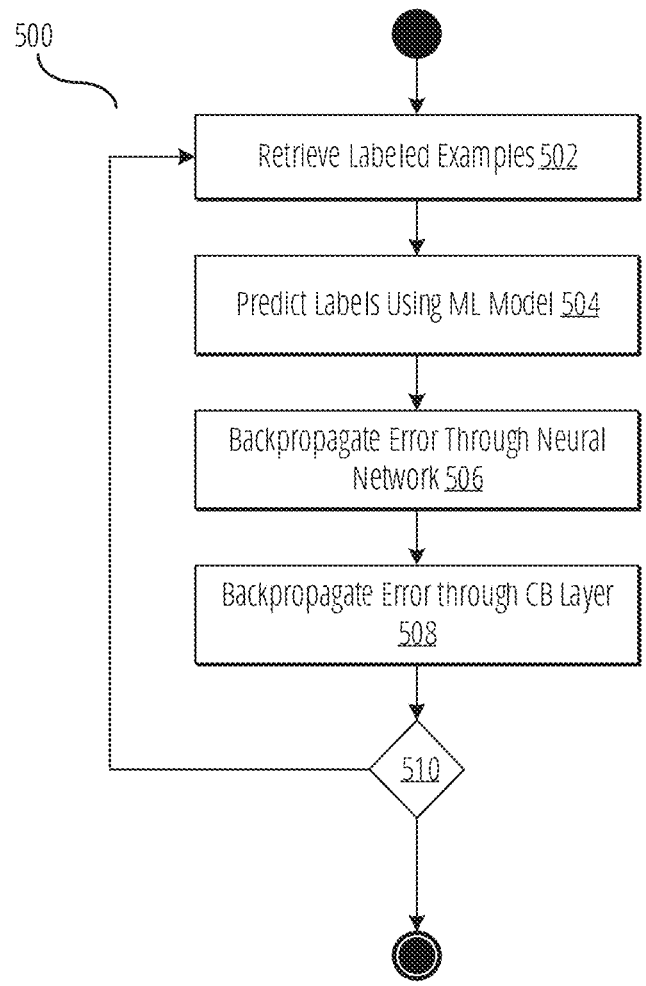
FIG. 5 is a flow diagram illustrating a method for training a circuit breaker model according to some of the example embodiments.

FIG. 5 is a flow diagram illustrating a method for training a circuit breaker model according to some of the example embodiments.

In step 502, method 500 can include retrieving a set of labeled examples. As described in connection with FIG. 1, the labeled examples can include a set of feature vectors that have been labeled (and corrected, as necessary) by previous iterations of a prediction phase. That is, during a prediction phase, human editors can manually determine if the prediction was accurate and accept the label, or alternatively can manually determine if the prediction was not accurate and change the label. The labels can then be persisted along with the feature vector(s) that generated the prediction as training data. In this way, the model can be continuously retrained using the reviewed predictions. In an embodiment, method 500 can initialize (e.g., randomize) all weights or biases in the model prior to predicting data in step 504.

In step 504, method 500 can include predicting labels for the examples using the model. In an embodiment, a predicted label can comprise the output of the model (e.g., the model discussed in FIG. 2). In an embodiment, during step 504, method 500 can compute an error according to a preconfigured cost or loss function (e.g., binary cross-entropy, log loss, etc.).

In step 506, method 500 can include backpropagating the error through the neural network and adjusting the weights and, if required, biases of each neuron in the neural network. Structural details of the neural network are provided in FIG. 2 and not repeated herein. In some embodiments, method 500 can use an optimization method (e.g., AdamW) to compute a set of weights for the neural network that minimizes the loss. Specific details of backpropagation are not provided herein for the sake of clarity.

In step 508, method 500 can include backpropagating the error through the CB layer. As depicted in FIG. 2, an initial input (i.e., hidden) layer of the neural network portion of the model is coupled to a CB layer. In current network designs, preliminary layers are trained separately. As such, the neural network would be trained independently of the CB layer. However, in an embodiment, the method 500 propagates the error from the first (hidden) layer of the neural network to the CB layer and updates weights and biases (e.g., weight tensor W and bias tensor B) based on the backpropagated error from the first layer of the neural network.

In step 510, method 500 can include determining if the changes in weights during the backpropagation in steps 506 and 508 are below a terminating threshold. If so, method 500 ends, and the final weights and biases are stored as the trained model. If the changes in weights do not fall below the terminating threshold, method 500 executes another iteration of prediction and backpropagation until the terminating threshold is met.

Figure 6:
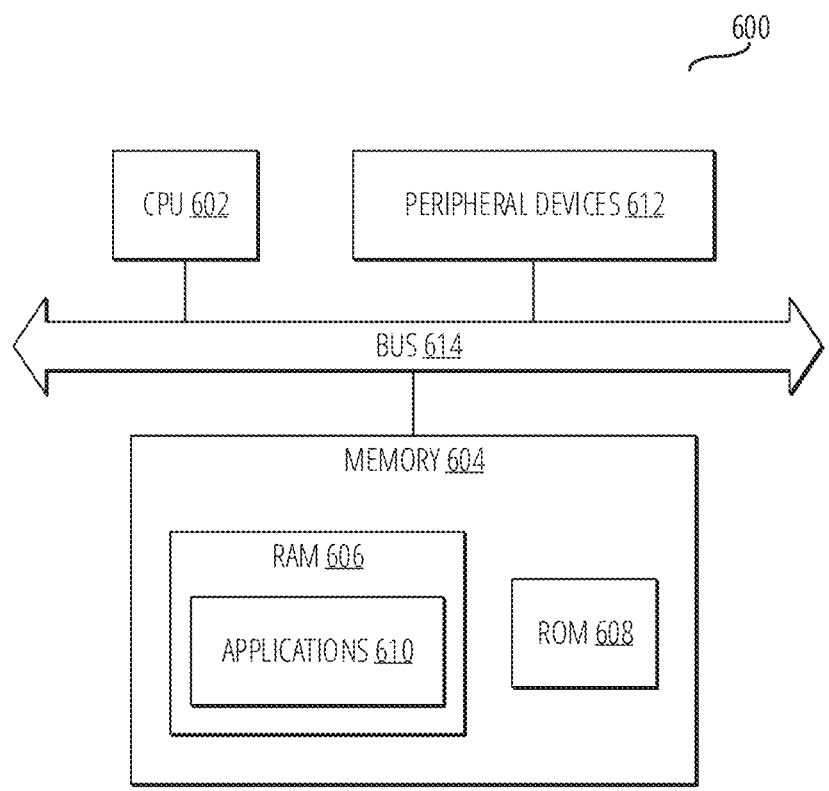
FIG. 6 is a block diagram of a computing device according to some embodiments of the disclosure.

FIG. 6 is a block diagram of a computing device according to some embodiments of the disclosure.

As illustrated, the computing device 600 includes a processor or central processing unit (CPU) such as CPU 602 in communication with a memory 604 via a bus 614. The device also includes one or more input/output (I/O) or peripheral devices 612. Examples of peripheral devices include, but are not limited to, network interfaces, audio interfaces, display devices, keypads, mice, keyboard, touch screens, illuminators, haptic interfaces, global positioning system (GPS) receivers, cameras, or other optical, thermal, or electromagnetic sensors.

In some embodiments, the CPU 602 may comprise a general-purpose CPU. The CPU 602 may comprise a single-core or multiple-core CPU. The CPU 602 may comprise a system-on-a-chip (SoC) or a similar embedded system. In some embodiments, a graphics processing unit (GPU) may be used in place of, or in combination with, a CPU 602. Memory 604 may comprise a non-transitory memory system including a dynamic random-access memory (DRAM), static random-access memory (SRAM), Flash (e.g., NAND Flash), or combinations thereof. In one embodiment, bus 614 may comprise a Peripheral Component Interconnect Express (PCIe) bus. In some embodiments, bus 614 may comprise multiple busses instead of a single bus.

Memory 604 illustrates an example of non-transitory computer storage media for the storage of information such as computer-readable instructions, data structures, program modules, or other data. Memory 604 can store a basic input/output system (BIOS) in read-only memory (ROM), such as ROM 608, for controlling the low-level operation of the device. The memory can also store an operating system in random-access memory (RAM) for controlling the operation of the device or otherwise causing the device to perform one or more operations.

Applications 610 may include computer-executable instructions which, when executed by the device, cause the computing device 600 to perform any of the methods (or portions of the methods) described previously in the description of the preceding Figures. In some embodiments, the software or programs implementing the method embodiments can be read from a hard disk drive (not illustrated) and temporarily stored in RAM 606 by CPU 602. CPU 602 may then read the software or data from RAM 606, process them, and store them in RAM 606 again.

The device may optionally communicate with a base station (not shown) or directly with another computing device. One or more network interfaces in peripheral devices 612 are sometimes referred to as a transceiver, transceiving device, or network interface card (NIC).

An audio interface in peripheral devices 612 produces and receives audio signals such as the sound of a human voice. For example, an audio interface may be coupled to a speaker and microphone (not shown) to enable telecommunication with others or generate an audio acknowledgment for some action. Displays in peripheral devices 612 may comprise liquid crystal display (LCD), gas plasma, light-emitting diode (LED), or any other type of display device used with a computing device. A display may also include a touch-sensitive screen arranged to receive input from an object such as a stylus or a digit from a human hand.

A keypad in peripheral devices 612 may comprise any input device arranged to receive input from a user. An illuminator in peripheral devices 612 may provide a status indication or provide light. The device can also comprise an input/output interface in peripheral devices 612 for communication with external devices, using communication technologies, such as USB, infrared, Bluetooth™, or the like. A haptic interface in peripheral devices 612 provides tactile feedback to a user of the client device.

A GPS receiver in peripheral devices 612 can determine the physical coordinates of the device on the surface of the Earth, which typically outputs a location as latitude and longitude values. A GPS receiver can also employ other geo-positioning mechanisms, including, but not limited to, triangulation, assisted GPS (AGPS), E-OTD, CI, SAI, ETA, BSS, or the like, to further determine the physical location of the device on the surface of the Earth. In one embodiment, however, the device may communicate through other components, providing other information that may be employed to determine the physical location of the device, including, for example, a media access control (MAC) address, Internet Protocol (IP) address, or the like.

The device may include more or fewer components than those shown in FIG. 6, depending on the deployment or usage of the device. For example, a server computing device, such as a rack-mounted server, may not include audio interfaces, displays, keypads, illuminators, haptic interfaces, Global Positioning System (GPS) receivers, or cameras/sensors. Some devices may include additional components not shown, such as graphics processing unit (GPU) devices, cryptographic co-processors, artificial intelligence (AI) accelerators, or other peripheral devices.

The subject matter disclosed above may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, the subject matter may be embodied as methods, devices, components, or systems. Accordingly, embodiments may, for example, take the form of hardware, software, firmware, or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in an embodiment" as used herein does not necessarily refer to the same embodiment, and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms such as "and," "or," or "and/or," as used herein may include a variety of meanings that may depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

The present disclosure is described with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general-purpose computer to alter its function as detailed herein, a special purpose computer, application-specific integrated circuit (ASIC), or other programmable data processing apparatus, such that the instructions, which execute via the processor of the computer or other programmable data processing apparatus, implement the functions/acts specified in the block diagrams or operational block or blocks. In some alternate implementations, the functions or acts noted in the blocks can occur out of the order noted in the operational illustrations. For example, two blocks shown in succession can, in fact, be executed substantially concurrently, or the blocks can sometimes be executed in the reverse order, depending upon the functionality or acts involved.

These computer program instructions can be provided to a processor of a general-purpose computer to alter its function to a special purpose; a special purpose computer; ASIC; or other programmable digital data processing apparatus, such that the instructions, which execute via the processor of the computer or other programmable data processing apparatus, implement the functions or acts specified in the block diagrams or operational block or blocks, thereby transforming their functionality in accordance with embodiments herein.

For the purposes of this disclosure, a computer-readable medium (or computer-readable storage medium) stores computer data, which data can include computer program code or instructions that are executable by a computer, in machine-readable form. By way of example, and not limitation, a computer-readable medium may comprise computer-readable storage media for tangible or fixed storage of data or communication media for transient interpretation of code-containing signals. Computer-readable storage media, as used herein, refers to physical or tangible storage (as opposed to signals) and includes without limitation volatile and non-volatile, removable, and non-removable media implemented in any method or technology for the tangible storage of information such as computer-readable instructions, data structures, program modules or other data. Computer-readable storage media includes, but is not limited to, RAM, ROM, EPROM, EEPROM, flash memory or other solid-state memory technology, CD-ROM, DVD, or other optical storage, magnetic cassettes, magnetic tape, magnetic disk storage, or other magnetic storage devices, or any other physical or material medium which can be used to tangibly store the desired information or data or instructions and which can be accessed by a computer or processor.

For the purposes of this disclosure, a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer-readable medium for execution by a processor. Modules may be integral to one or more servers or be loaded and executed by one or more servers. One or more modules may be grouped into an engine or an application.

Those skilled in the art will recognize that the methods and systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than or more than all the features described herein are possible.

Functionality may also be, in whole or in part, distributed among multiple components, in manners now known or to become known. Thus, a myriad of software, hardware, and firmware combinations are possible in achieving the functions, features, interfaces, and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments of methods presented and described as flowcharts in this disclosure are provided by way of example to provide a complete understanding of the technology. The disclosed methods are not limited to the operations and logical flow presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A method comprising:
   receiving telemetry data from one or more network applications;
   generating a set of feature vectors based on the telemetry data, the set of feature vectors associated with at least one network application in the one or more network applications;
   inputting the set of feature vectors into a machine learning model to generate a prediction, the prediction comprising a binary classification of the set of feature vectors; and
   triggering at least one circuit breaker function modifying operations of the at least one network application in response to the prediction when the prediction comprises a positive prediction.

2. The method of claim 1, wherein inputting the set of feature vectors into a machine learning model comprises inputting the set of feature vectors into a neural network.

3. The method of claim 2, wherein inputting the set of feature vectors into a neural network comprises inputting the set of feature vectors into a pretraining layer, the pretraining layer outputting data to a plurality of transform layers, each layer in the plurality of transform layers comprising an activation layer and a linear transformation layer.

4. The method of claim 3, wherein the pretraining layer comprises a memory layer, the memory layer outputting data to a circuit breaker layer.

5. The method of claim 3, the method further comprising training the neural network by backpropagating a loss from the neural network through the pretraining layer.

6. The method of claim 1, wherein triggering at least one circuit breaker function comprises triggering a plurality of circuit breaker functions.

7. The method of claim 1, wherein triggering at least one circuit breaker function comprises transmitting an alert and receiving a response to the alert, wherein the method further comprises using the response to the alert as a label for training the machine learning model.

8. A non-transitory computer-readable storage medium, the non-transitory computer-readable storage medium including instructions that when executed by a computer, cause the computer to:
   receive telemetry data from one or more network applications;
   generate a set of feature vectors based on the telemetry data, the set of feature vectors associated with at least one network application in the one or more network applications;
   inputting the set of feature vectors into a machine learning model to generate a prediction, the prediction comprising a binary classification of the set of feature vectors; and
   trigger at least one circuit breaker function modifying operations of the at least one network application in response to the prediction when the prediction comprises a positive prediction.

9. The non-transitory computer-readable storage medium of claim 8, wherein inputting the set of feature vectors into a machine learning model comprises inputting the set of feature vectors into a neural network.

10. The non-transitory computer-readable storage medium of claim 9, wherein inputting the set of feature vectors into a neural network comprises inputting the set of feature vectors into a pretraining layer, the pretraining layer outputting data to a plurality of transform layers, each layer in the plurality of transform layers comprising an activation layer and a linear transformation layer.

11. The non-transitory computer-readable storage medium of claim 10, wherein the pretraining layer comprises a memory layer, the memory layer outputting data to a circuit breaker layer.

12. The non-transitory computer-readable storage medium of claim 10, the instructions further causing the computer to train the neural network by backpropagating a loss from the neural network through the pretraining layer.

13. The non-transitory computer-readable storage medium of claim 8, wherein trigger at least one circuit breaker function comprises triggering a plurality of circuit breaker functions.

14. The non-transitory computer-readable storage medium of claim 8, wherein triggering at least one circuit breaker function comprises transmit an alert and receiving a response to the alert, wherein the instructions further cause the computer to use the response to the alert as a label for training the machine learning model.

15. A device comprising:
a processor configured to:
receive telemetry data from one or more network applications;
generate a set of feature vectors based on the telemetry data, the set of feature vectors associated with at least one network application in the one or more network applications;
inputting the set of feature vectors into a machine learning model to generate a prediction, the prediction comprising a binary classification of the set of feature vectors; and
trigger at least one circuit breaker function modifying operations of the at least one network application in response to the prediction when the prediction comprises a positive prediction.

16. The device of claim 15, wherein inputting the set of feature vectors into a machine learning model comprises inputting the set of feature vectors into a neural network.

17. The device of claim 16, wherein inputting the set of feature vectors into a neural network comprises inputting the set of feature vectors into a pretraining layer, the pretraining layer outputting data to a plurality of transform layers, each layer in the plurality of transform layers comprising an activation layer and a linear transformation layer.

18. The device of claim 17, wherein the pretraining layer comprises a memory layer, the memory layer outputting data to a circuit breaker layer.

19. The device of claim 17, the processor further configured to train the neural network by backpropagating a loss from the neural network through the pretraining layer.

20. The device of claim 15, wherein trigger at least one circuit breaker function comprises triggering a plurality of circuit breaker functions.

* * * * *